United States Patent [19]
Park et al.

[11] Patent Number: 5,943,570
[45] Date of Patent: Aug. 24, 1999

[54] METHODS OF FORMING CAPACITOR ELECTRODES CONTAINING HSG SEMICONDUCTOR LAYERS THEREIN

[75] Inventors: Young-wook Park, Kyungki-do; Young-sun Kim, Kyunki-do; Seung-hee Nam, Seoul; Se-jin Shim, Kyungki-do; Cha-young Yoo, Suwon; Kwan-young Oh, Kyungki-do, all of Rep. of Korea

[73] Assignee: Samsung Electronics Co., Ltd., Rep. of Korea

[21] Appl. No.: 08/780,636

[22] Filed: Jan. 8, 1997

[30] Foreign Application Priority Data

Apr. 10, 1996 [KR] Rep. of Korea ............. 96-10787
May 29, 1996 [KR] Rep. of Korea ............. 96-18524

[51] Int. Cl.$^6$ ................................. H01L 21/8242
[52] U.S. Cl. ........................... 438/255; 438/665
[58] Field of Search .................. 438/255, 665, 438/398, 597, 964; 257/309

[56] References Cited

U.S. PATENT DOCUMENTS

| | | |
|---|---|---|
| 5,102,820 | 4/1992 | Chiba . |
| 5,208,479 | 5/1993 | Mathews et al. . |
| 5,227,651 | 7/1993 | Kim et al. . |
| 5,234,857 | 8/1993 | Kim et al. . |
| 5,597,754 | 1/1997 | Lou et al. . |
| 5,618,747 | 4/1997 | Lou et al. . |
| 5,663,085 | 9/1997 | Tanigawa . |
| 5,721,171 | 2/1998 | Ping et al. . |
| 5,741,734 | 4/1998 | Lee . |
| 5,763,306 | 6/1998 | Tsai . |
| 5,811,333 | 9/1998 | Zenke . |

Primary Examiner—Charles Bowers
Assistant Examiner—Scott J. Hawranek
Attorney, Agent, or Firm—Myers Bigel Sibley & Sajovec

[57] ABSTRACT

A capacitor for a semiconductor memory device and a method for manufacturing the same are provided. A lower electrode of a capacitor according to the present invention has a structure in which a first conductive layer and a second conductive layer are sequentially deposited and an HSG is selectively formed on the surface thereof. The first conductive layer is composed of an amorphous or a polycrystalline silicon film having a low concentration of impurities. The second conductive layer is composed of an amorphous silicon film having a high concentration of impurities. According to the present invention, it is possible to obtain a desirable Cmin/Cmax ratio in the lower electrode of the capacitor having an HSG silicon layer and to prevent diffusion of impurities from the lower electrode of the capacitor.

6 Claims, 6 Drawing Sheets

METHODS OF FORMING CAPACITOR ELECTRODES CONTAINING HSG SEMICONDUCTOR LAYERS THEREIN

BACKGROUND OF THE INVENTION

The present invention relates to a semiconductor memory device and a method for manufacturing the same, and more particularly, to a capacitor of a semiconductor memory device having a cylindrical storage electrode composed of a selective hemispherical grained silicon layer and a method for manufacturing the same.

As the integration density of semiconductor memory devices, such as a dynamic random access memory DRAM increases, the area occupied by a unit cell consisting of a transistor and a cell capacitor is gradually decreased. A decrease in cell capacitance due to a decrease in the area of a memory cell seriously restricts the integration density of the DRAM. The decrease in cell capacitance further deteriorates the ability to read data from the memory cell, increases soft error rate, hinders the operation of a device in a low voltage state, and deteriorates a refresh characteristic, thus increasing consumption of currents. Therefore, problems caused by the decrease in cell capacitance should be solved in order to obtain high density semiconductor memory device integration.

There are methods for forming a dielectric film using a material having a high dielectric constant and for forming a thin dielectric film, in order to increase the cell capacitance. However, the method for forming the dielectric film with a material having a high dielectric constant generally has the problems that leakage currents are large and breakdown voltage is low, and the method for forming the thin dielectric film deteriorates the reliability of the semiconductor device by increasing the leakage currents.

Therefore, a method for increasing the capacitance by increasing the surface area of the capacitor electrode was suggested. As a representative example, it is possible to easily increase the surface area of a lower electrode if an HSG silicon layer having hemisphere-shaped grains is selectively formed on the lower electrode surface to improve the capacitance thereof.

FIGS. 1 to 3 are sectional views for explaining the method for selectively forming the HSG silicon layer only in the lower electrode of the capacitor of the semiconductor memory device according to a conventional technology.

Referring to FIG. 1, an insulating film, for example, an oxide film 3 is formed on a semiconductor substrate 1 and patterned to form a contact hole $h_1$ which exposes a predetermined area of the semiconductor substrate 1.

Referring to FIG. 2, an amorphous silicon is deposited on the resultant structure shown in FIG. 1 to form a conductive layer 5 filling the contact hole $h_1$.

Referring to FIG. 3, a lower electrode 7 for covering the contact hole $h_1$ is formed by patterning the conductive layer 5 and an HSG silicon layer 9 is formed on the surface of the lower electrode 7. In this case, the lower electrode 7 should be in an amorphous state and the impurity concentration thereof should be increased to reduce a resistance thereof.

However, when the impurity concentration of the lower electrode 7 is increased, impurities are diffused into the semiconductor substrate 1 contacting the lower electrode 7. Accordingly, the impurity concentration of the semiconductor substrate 1, namely, a source area or a drain area thereof is changed, thus deteriorating the characteristic of the transistor.

As mentioned above, the impurity concentration of the source and drain areas of the semiconductor substrate 1 is directly affected by the impurity concentration of the lower electrode 7. Therefore, the lower the impurity concentration of the lower electrode 7, the less amount of change of the impurity concentration of the source and drain areas during a following thermal process. However, when the impurity concentration of the lower electrode 7 is reduced, a phenomenon occurs in a MOS capacitor structure, namely, the phenomenon in which the capacitance changes according to the magnitude of a voltage applied to the electrode of the capacitor occurs. Especially, in the capacitor structure in which the HSG film 9 is formed on the surface of the lower electrode 7, the amount of change of the capacitance increases more than in a general capacitor structure without the HSG film 9. This is because depletion layers formed in the hemisphere-shaped grains constituting the HSG film 9 overlap each other, which increases the width of an actual depletion layer. When such a phenomenon occurs, a minimum capacitance Cmin and a maximum capacitance Cmax exist within a certain voltage range since the capacitance changes according to the voltage applied to the electrode of the capacitor.

FIG. 4 is a graph showing the change of Cmin and Cmax according to an impurity doping concentration when an HSG layer is formed on a lower electrode of the capacitor and when an HSG layer is not formed thereon.

In FIG. 4, phosphorus (P) is used as the impurity which is doped in the lower electrode. Here, Cmin/Cmax obtained when no HSG layer is formed on the surface of the lower electrode, represented as (■), is compared with that obtained when an HSG layer, represented as (●), is formed thereon, under the condition that $PH_3$ is used as a phosphorus source gas and the flow rate thereof is changed to 5, 7,and 15 sccm, respectively. While Cmin/Cmax is sharply lowered as the flow rate of the $PH_3$ is reduced when the HSG layer is formed on the surface of the lower electrode, Cmin/Cmax are not sharply lowered in spite of the change in the flow rate of the $PH_3$, when no HSG layer is formed.

According to the above result, it is necessary to form a lower electrode having a new structure in which Cmin/Cmax are not reduced when an HSG layer is formed on the lower electrode surface.

SUMMARY OF THE INVENTION

It is an object of the present invention to provide a capacitor for a semiconductor memory device wherein a satisfactory value of Cmin/Cmax can be obtained and a diffusion of impurities from a lower electrode of the capacitor can be prevented.

It is another object of the present invention to provide a method for manufacturing the above-mentioned capacitor for a semiconductor memory device.

To achieve the first object, there is provided a capacitor for a semiconductor memory device having a lower electrode in which a first conductive layer and a second conductive layer are deposited in turn and an HSG layer is selectively formed on the surface of the lower electrode, wherein the first conductive layer is formed of an amorphous silicon film having a first impurity concentration and the second conductive layer is composed of an amorphous silicon film having a second impurity concentration which is higher than the first impurity concentration.

The impurities are preferably phosphorus (P) or arsenic (As).

There is provided a capacitor for a semiconductor memory device having a lower electrode in which a first conductive layer and a second conductive layer are deposited in turn and an HSG layer is selectively formed on the surface of the lower electrode, wherein the first conductive layer is composed of a polycrystalline silicon film having a first impurity concentration and the second conductive layer is composed of an amorphous silicon film having a second impurity concentration which is higher than the first impurity concentration.

A crystallizing cut-off film is preferably further provided between the first conductive layer and the second conductive layer. The crystallizing cut-off film is preferably an oxide film.

To achieve the second object, there is provided a method for manufacturing a capacitor for a semiconductor memory device, comprising the steps of forming a contact hole which partially exposes a semiconductor substrate by partially etching an insulating layer formed on the semiconductor substrate, forming a first conductive layer and a second conductive layer in turn on the semiconductor substrate having the contact hole, forming a lower electrode pattern in which a first conductive layer pattern and a second conductive layer pattern are deposited in turn by patterning the second conductive layer and the first conductive layer, and forming a HSG silicon layer on the surface of the lower electrode pattern by a selective HSG forming processing. The first conductive layer is preferably formed of an amorphous silicon film having a first impurity concentration, and the second conductive layer is preferably formed of an amorphous silicon film having a second impurity concentration which is higher than the first impurity concentration. The first conductive layer may be formed of a polycrystalline silicon film having a first impurity concentration, and the second conductive layer may be formed of an armophous silicon film having a second impurity concentration which is higher than the first impurity concentration.

There is provided a method for manufacturing a capacitor for a semiconductor memory device, comprising the steps of forming a contact hole which partially exposes a semiconductor substrate by partially etching an insulating layer formed on the semiconductor substrate, forming a first conductive layer, a crystallizing cut-off film, and a second conductive layer sequentially on the semiconductor substrate having the contact hole, forming a lower electrode pattern in which a first conductive layer pattern, a crystallizing cut-off film pattern, and a second conductive layer pattern are sequentially deposited by patterning the second conductive layer, the crystallizing cut-off film, and the first conductive layer, forming an undercut region by wet etching the crystallizing cut-off film pattern disposed between the first and second conductive layer patterns of the lower electrode pattern to a predetermined width, and forming an HSG silicon layer on the surface of the second conductive layer pattern and in the undercut region through a selective HSG deposition process.

The first conductive layer is preferably formed of a polycrystalline silicon film having a first impurity concentration, the crystallizing cut-off film is preferably formed of an oxide film, and the second conductive layer is preferably formed of an amorphous silicon film having a second impurity concentration which is higher than the first impurity concentration. The oxide film may be formed by a chemical vapor deposition (CVD) or by thermal oxidation.

The step for forming the first conductive layer preferably comprises the steps of depositing an amorphous silicon film having a first impurity concentration and crystallizing the amorphous silicon film through thermal processing.

According to the present invention, it is possible to obtain a satisfactory value of Cmin/Cmax in the lower electrode of the capacitor having the HSG silicon layer structure and prevent the diffusion of impurities from the lower electrode of the capacitor.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Hereinafter, preferred embodiments of the present invention are described in detail with reference to the attached drawings.

In the present invention, to prevent the diffusion of impurities from a capacitor and obtain a stable Cmin/Cmax in the capacitor having an HSG silicon layer, a silicon layer having a low impurity concentration is formed in a portion of the capacitor contacting a silicon substrate when forming a lower electrode, thus preventing deterioration of an isolation characteristic and a transistor characteristic by suppressing a re-diffusion of the impurities during a following thermal processing, and then a silicon layer having a high impurity concentration is formed on the silicon layer having a low impurity concentration.

Embodiment 1

Figure 1:
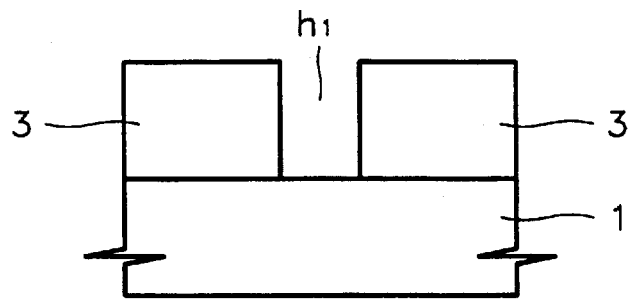
FIGS. 1 to 3 are sectional views for explaining a method for manufacturing a capacitor of a semiconductor memory device according to a conventional technology.
Figure 2:
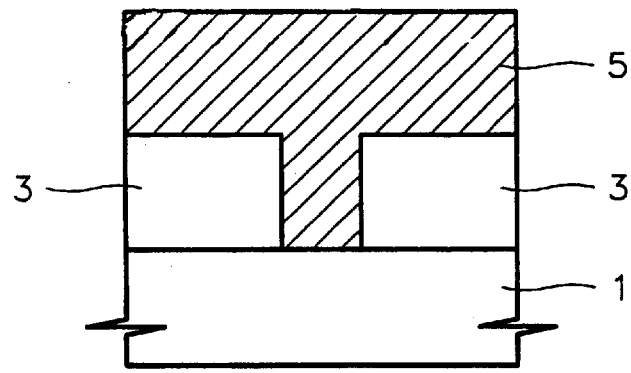
Figure 3:
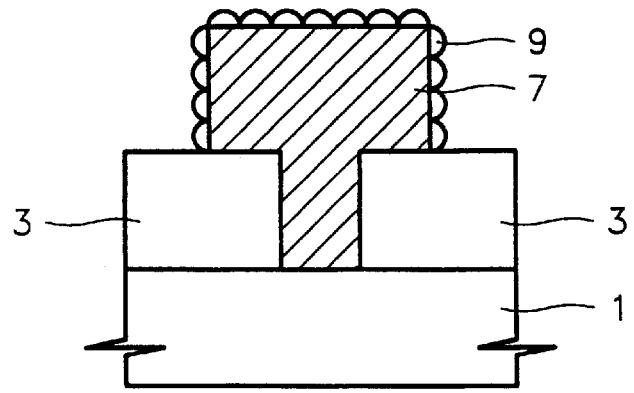
Figure 4:
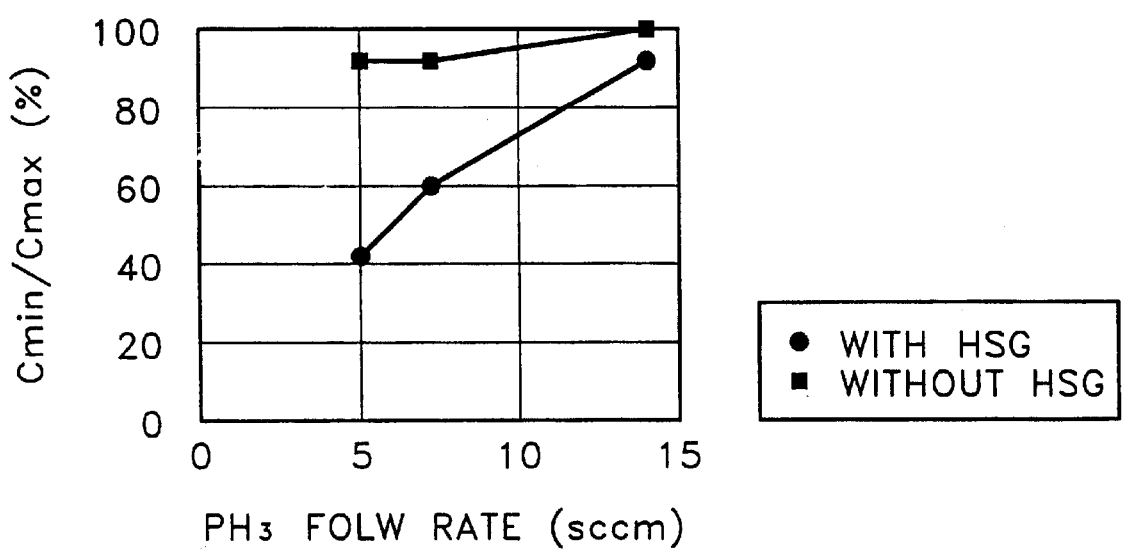
FIG. 4 is a graph showing a change of Cmin/Cmax according to an impurity doping concentration in the case of forming an HSG layer in a lower electrode of the capacitor and in the general case of not forming the HSG layer.
Figure 5:
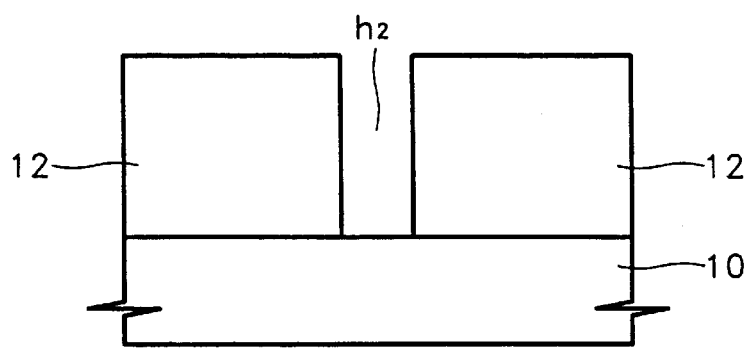
FIGS. 5 to 7 are sectional views for explaining a method for manufacturing a capacitor of a semiconductor memory device according to a first embodiment of the present invention.
Figure 6:
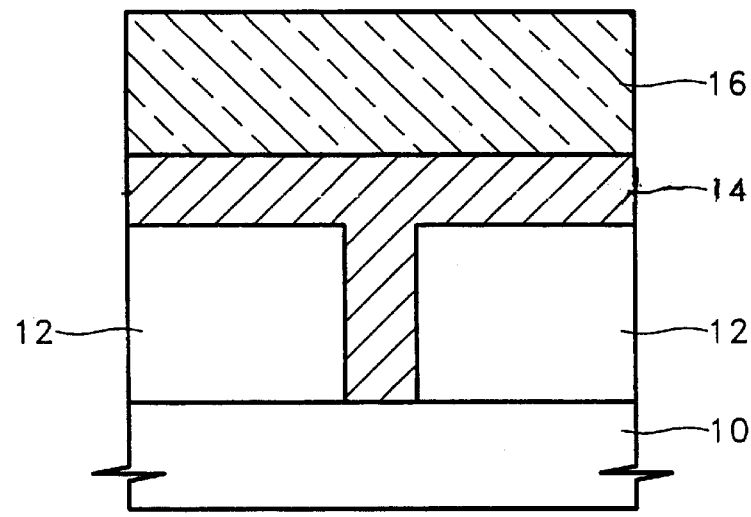
Figure 7:
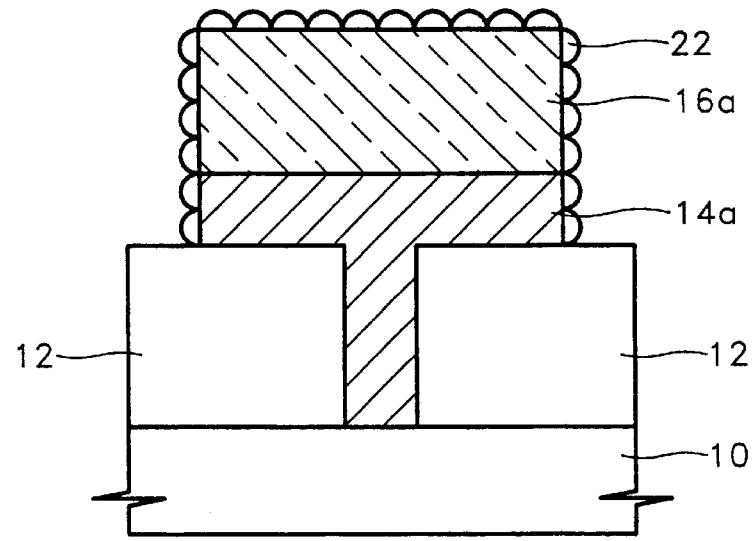

FIGS. 5 to 7 are sectional views for describing a method for manufacturing a capacitor of a semiconductor memory device by selectively forming an HSG silicon layer only on a lower electrode according to a first embodiment of the present invention.

Referring to FIG. 5, an insulating layer is formed on a semiconductor substrate 10 on which a substructure such as a transistor is formed. Then, a contact hole $h_2$ which exposes a portion of the semiconductor substrate 10 is formed by forming a photoresist pattern (not shown) on the insulating layer using a photolithography process, and etching the insulating layer using the photoresist pattern as an etching mask so as to form an insulating layer pattern 12.

Referring to FIG. 6, after the photoresist pattern is removed, a first conductive layer 14 is formed by depositing an amorphous silicon film having a first impurity concentration on the resultant structure having the contact hole $h_2$ to reduce the amount of impurities which diffuse into the semiconductor substrate 10, namely, an active region such as a source or drain region of a transistor. Then, a second conductive layer 16 is formed by depositing an amorphous silicon film having a second impurity concentration which is higher than the first impurity concentration of the first conductive layer 14. Here, phosphorus (P) or arsenic (As) can be used as the impurity.

Referring to FIG. 7, a lower electrode pattern composed of a first conductive layer pattern 14a and a second conductive layer pattern 16a is formed by coating a photoresist on the second conductive layer 16, forming a photoresist pattern (not shown), and etching the second conductive layer 16 and the first conductive layer 14 consecutively using the photoresist pattern as an etching mask.

Then, an HSG silicon layer 22 is formed on a surface of the lower electrode pattern which includes the first conductive layer pattern 14a and the second conductive layer pattern 16a by applying a selective HSG processing, so as to form a lower electrode having the increased surface area thereof. Then, a dielectric film (not shown) and an upper electrode (not shown) are formed and a general CMOS forming process is performed.

Embodiment 2

Figure 8:
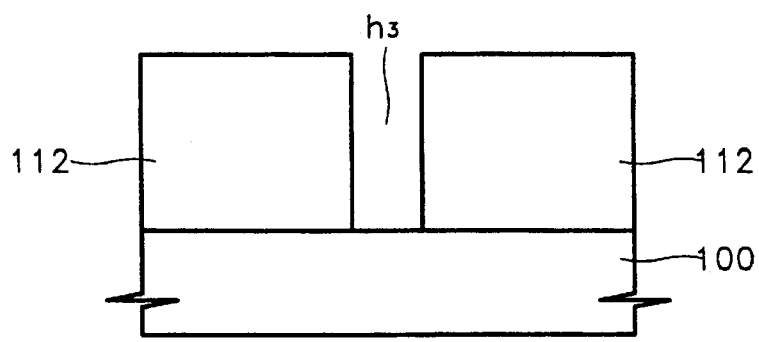
FIGS. 8 to 10 are sectional views for explaining a method for manufacturing a capacitor of a semiconductor memory device according to a second embodiment of the present invention.
Figure 9:
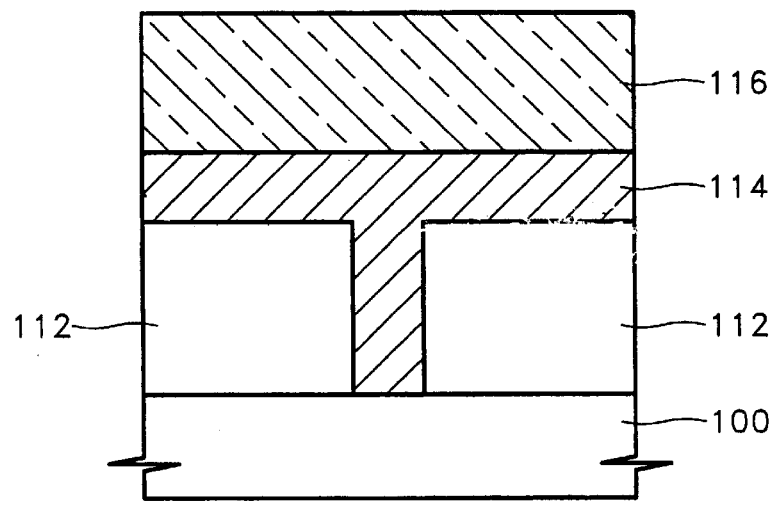
Figure 10:
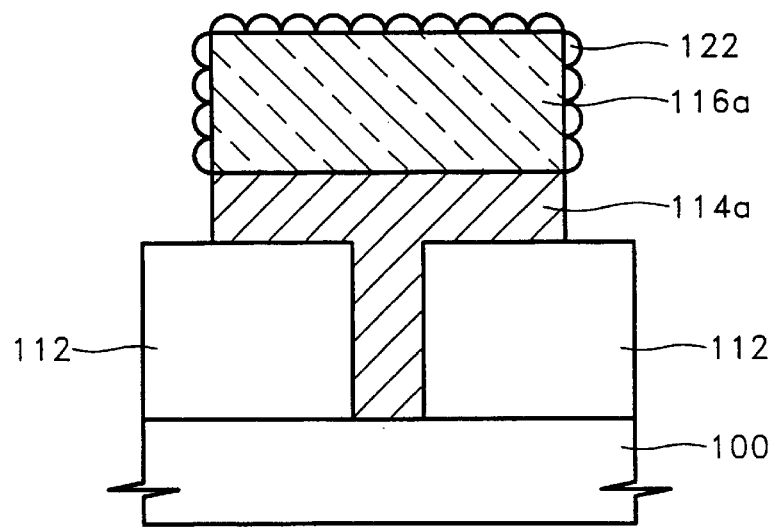

FIGS. 8 to 10 are sectional views for explaining a method for manufacturing a capacitor of a semiconductor memory device using a selective HSG processing according to a second embodiment of the present invention.

Referring to FIG. 8, an insulating layer is formed on a semiconductor substrate 100 to insulate a substructure such as a transistor. Then, a contact hole $h_3$ which exposes a portion of the semiconductor substrate 100 is formed by etching the insulating layer using a photoresist pattern (not shown) as an etching mask, so as to form an insulating layer pattern 112.

Referring to FIG. 9, after the photoresist pattern is removed, conductive layers, for example, a first conductive layer 114 composed of a polycrystalline silicon film having a first impurity concentration and a second conductive layer 116 composed of an amorphous silicon film having a second impurity concentration which is higher than the first impurity concentration are consecutively deposited on the above resultant structure in which the contact hole $h_3$ was formed. Alternatively, the first conductive layer 114 can be formed by depositing an amorphous silicon film, instead of polycrystalline silicon film, having the first impurity concentration, and crystallizing the amorphous silicon film by a heat processing, a plasma processing or an irradiation of an electron beam or a laser beam. Thus formed first conductive layer 114 can prevent the formation of an HSG silicon layer thereon during a following HSG silicon layer forming process.

Referring to FIG. 10, a lower electrode pattern composed of a first conductive layer pattern 114a and a second conductive layer pattern 116a is formed by coating a photoresist on the second conductive layer 116, forming a photoresist pattern (not shown), and etching the second conductive layer 116 and the first conductive layer 114 consecutively using the photoresist pattern as an etching mask.

Then, an HSG silicon layer 122 is formed only on the surface of the second conductive layer pattern 116a so as to form a lower electrode. Here, since the first conductive layer pattern 114a is composed of polycrystalline silicon having the low impurity concentration as mentioned above, the diffusion of the impurities from the lower electrode to the semiconductor substrate is suppressed during a following thermal processing.

Embodiment 3

FIGS. 11 to 15 are sectional views for explaining a method for manufacturing a capacitor for a semiconductor memory device using a selective HSG processing according to a third embodiment of the present invention.

Figure 11:
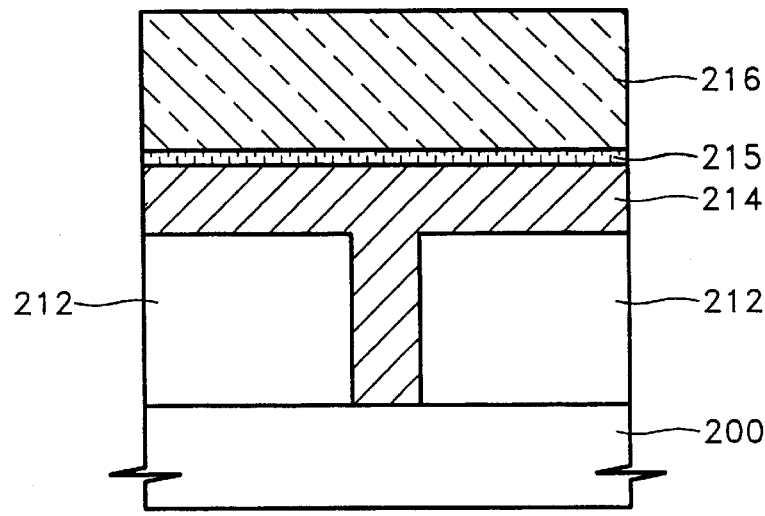
FIGS. 11 to 13 are sectional views for explaining a method for manufacturing a capacitor of a semiconductor memory device according to a third embodiment of the present invention.

Referring to FIG. 11, an insulating layer pattern 212 for insulating the substructure is formed on a semiconductor substrate 200 by the same method described in the second embodiment with reference to FIG. 8.

Then, conductive layers, for example, a first conductive layer 214 composed of a polycrystalline silicon film having a first impurity concentration, a crystallizing cut-off film 215, a second conductive layer 216 composed of an amorphous silicon film having a second impurity concentration which is higher than the first impurity concentration are deposited in turn on the above resultant structure. Alternatively, the first conductive layer 214 can be formed by depositing an amorphous silicon film having the first impurity concentration, and crystallizing the amorphous silicon film by a heat processing, a plasma processing, or an irradiation of an electron beam or a laser beam, like in the first embodiment. Also, the crystallizing cut-off film 215 can be formed of, for example, an oxide film formed by a chemical vapor deposition (CVD) or a thermal oxidation to a thickness of less than 100 Å.

Figure 12:
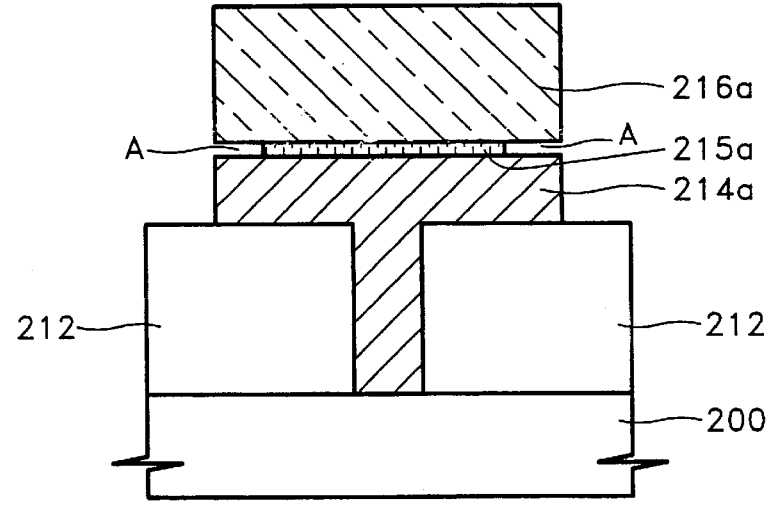

Referring to FIG. 12, a lower electrode pattern composed of a first conductive layer pattern 214a, a first crystallizing cut-off film pattern (not shown), and a second conductive layer pattern 216a is formed by forming a photoresist pattern (not shown) on the second conductive layer 216 and etching the second conductive layer 216, the crystallizing cut-off film 215, and the first conductive layer 214 consecutively. Then, an undercut area A is formed between the first conductive layer pattern 214a and the second conductive layer pattern 216a and a second crystallizing cut-off film pattern 215a is formed at the same time by removing a portion of the first crystallizing cut-off film pattern to a predetermined width by wet etching.

Figure 13:
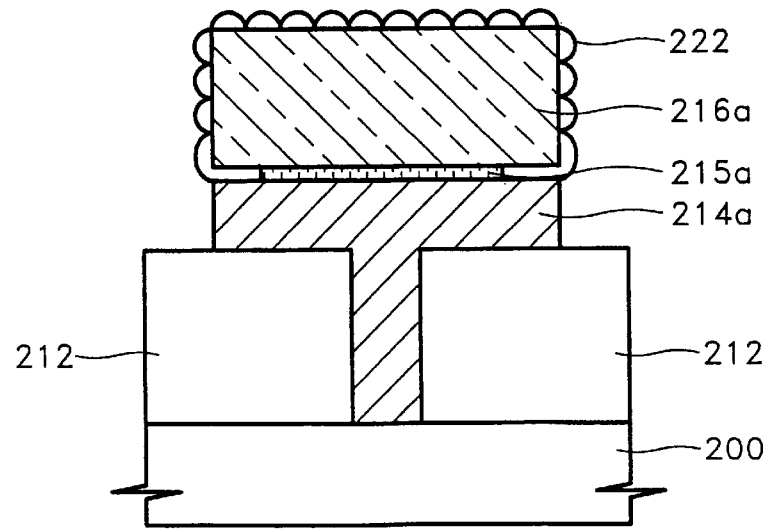

Referring to FIG. 13, an HSG silicon layer 222 is formed only on the surface of the second conductive layer pattern 216a and in the undercut area A. Here, the first conductive layer pattern 214a and the second conductive layer pattern 216a are connected to each other by the HSG silicon layer 222 formed in the undercut area A. Since the first conductive layer pattern 214a is formed of a polycrystalline silicon film having a low impurity concentration like in the second embodiment, diffusion of the impurities from the lower electrode to the semiconductor substrate can be suppressed during a following thermal processing.

Generally, when depositing an amorphous silicon film including a high concentration of impurities on an underlayer formed of a polycrystalline silicon film having a low concentration of impurities, in order to form the conductive layer for the lower electrode of the semiconductor memory device, the crystallization of the amorphous silicon film may be expedited by the polycrystalline silicon film. However, according to the third embodiment, since the crystallizing cut-off film 215 is formed between the first conductive layer 214 composed of the polycrystalline silicon film and the second conductive layer 216 composed of the amorphous silicon film, the crystallization of the amorphous silicon film of the second conductive layer 216 by the polycrystalline silicon film of the first conductive layer 214 can be prevented.

Evaluation Example

Figure 14:
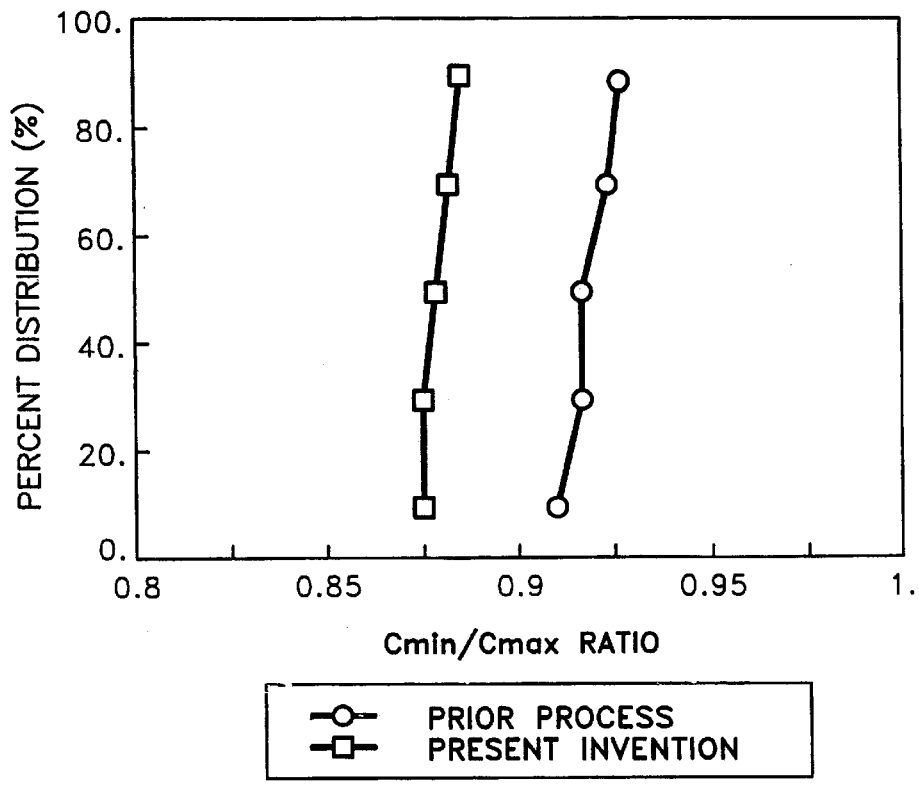
FIG. 14 is a graph comparing Cmin/Cmax in the lower electrode according to the conventional technology with that in the lower electrode according to the present invention.
Figure 15:
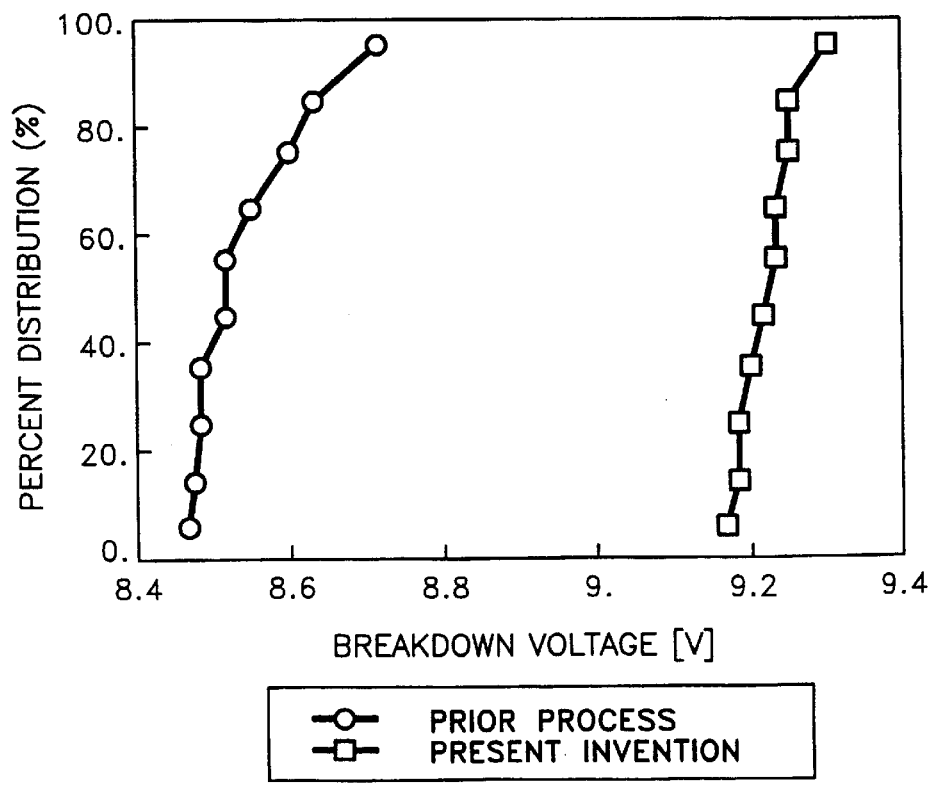
FIG. 15 is a graph showing breakdown voltage distributions in an isolation region according to the impurity concentration in the lower electrode according to the conventional technology and the present invention.

FIGS. 14 and 15 show the result of a comparison test between the prior art and the present invention when the impurity concentrations of the lower and upper portions of a lower electrode are varied from a low value to a high value. FIG. 14 is a graph comparing the Cmin/Cmax ratios of the lower electrodes according to a conventional technology and the present invention. FIG. 15 is a graph showing an isolation characteristic according to the impurity concentrations in the lower electrodes according to the conventional technology and the present invention, namely, the distribution of the breakdown voltage between adjacent active regions.

In performing the above tests, phosphorus (P) was used as the impurity doped in the lower electrode and $PH_3$ was used as a phosphorus source gas to form a silicon layer whose lower portion and upper portion have different impurity concentrations in an experimental sample according to the present invention. First, a first silicon layer of a low impurity concentration was formed to the thickness of about 8% of the whole thickness of the lower electrode, with a first input flow rate of the $PH_3$ being 3.5 sccm. Then, a second silicon layer of a high impurity concentration was formed by increasing a second input flow rate of the $PH_3$ to 10 sccm. An HSG layer, a dielectric film, and an upper electrode were sequentially formed on the surface of the second silicon layer in the described order. Here, the second silicon layer was formed of an amorphous silicon film. In the experimental sample according to the conventional technology, the lower electrode of a capacitor was formed of a single layer having a uniform impurity concentration by making the input flow rate of the $PH_3$ uniform, i.e., 10 sccm and the HSG layer, the dielectric film, and the upper electrode were sequentially formed on the surface thereof in the order described.

As noted from FIGS. 14 and 15, the Cmin/Cmax ratio (□) according to the present invention was decreased by about 5%, compared with the Cmin/Cmax ratio (○) according to the conventional technology. However, in the case that the impurity concentrations of the lower and upper portions of the lower electrode are formed to be different, i.e., in low and high concentrations according to the present invention (□), the breakdown in the isolation region is increased by more than about 15% compared with that of the conventional technology (○). Such an improvement in the breakdown voltage characteristic increases the reliability of a device.

It is noted from the results of FIGS. 14 and 15 that the deterioration of the device characteristics can be prevented if the impurity concentrations of the lower and upper portions of the lower electrode are different, when forming the HSG in the lower electrode to increase the surface area of the capacitor of the semiconductor memory device.

It is possible to prevent the diffusion of impurities from the lower electrode of the capacitor and to obtain a desirable Cmin/Cmax ratio when the capacitor of the semiconductor memory device is manufactured using the process according to the preferred embodiment of the present invention.

The present invention is not restricted to the above embodiments, and it is clearly understood that many variations can be possible within the scope and spirit of the present invention by anyone skilled in the art.

What is claimed is:

1. A method of forming an electrode of an integrated circuit capacitor, comprising the steps of:
   forming a first semiconductor layer having a first impurity concentration therein on a semiconductor substrate;
   forming a second amorphous semiconductor layer having a second impurity concentration therein which is greater than the first impurity concentration, on the first semiconductor layer;
   forming a crystallizing cutoff region between the first and second semiconductor layers, said crystallizing cutoff region having a thickness of less than about 100;
   etching a portion of the crystallizing cutoff region from between the first and second semiconductor layers; and
   growing a third semiconductor layer containing hemispherically-shaped grains of silicon that extend between and electrically connect the first and second semiconductor layers together.

2. The method of claim 1, wherein said step of forming a first semiconductor layer is preceded by the steps of forming an electrically insulating layer on a face of the semiconductor substrate and forming a contact hole which extends through the electrically insulating layer and exposes a portion of the face.

3. The method of claim 2, wherein said step of forming a first semiconductor layer comprises forming a first layer of a semiconductor selected from the group consisting of amorphous silicon and polycrystalline silicon, on the exposed portion of the face.

4. The method of claim 1, wherein said step of forming a first semiconductor layer comprises the steps forming a first layer of amorphous silicon in the contact hole and on the exposed portion of the face and then recrystallizing the first layer of amorphous silicon as a layer of polycrystalline silicon.

5. The method of claim 1, wherein said step of forming crystallizing cutoff region comprises forming a layer of oxide between the first and second semiconductor layers.

6. The method of claim 4, wherein said crystallizing step comprises annealing the first layer of amorphous silicon using at least one of a heat processing technique, a plasma processing technique, an electron beam irradiation technique and a laser irradiation technique.

* * * * *